US008941146B2

United States Patent
Kanamura (10) Patent No.: US 8,941,146 B2
(45) Date of Patent: Jan. 27, 2015

(54) COMPOUND SEMICONDUCTOR DEVICE AND MANUFACTURING METHOD

(75) Inventor: Masahito Kanamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 332 days.

(21) Appl. No.: 12/895,970

(22) Filed: Oct. 1, 2010

(65) Prior Publication Data

US 2011/0079822 A1 Apr. 7, 2011

(30) Foreign Application Priority Data

Oct. 2, 2009 (JP) ................................ 2009-230878

(51) Int. Cl.
 *H01L 29/66* (2006.01)
 *H01L 21/285* (2006.01)
 *H01L 29/417* (2006.01)
 *H01L 29/778* (2006.01)
 *H01L 29/20* (2006.01)

(52) U.S. Cl.
 CPC ...... *H01L 21/28587* (2013.01); *H01L 29/4175* (2013.01); *H01L 29/66462* (2013.01); *H01L 29/7787* (2013.01); *H01L 29/2003* (2013.01)
 USPC ............. 257/192; 257/E29.252; 257/E29.253

(58) Field of Classification Search
 USPC ........................... 257/192, E29.252, E29.253
 See application file for complete search history.

(56) References Cited

U.S. PATENT DOCUMENTS

| 7,777,305 | B2 | 8/2010 | Kuroda | |
|---|---|---|---|---|
| 2005/0258451 | A1* | 11/2005 | Saxler et al. | .................. 257/192 |
| 2005/0274977 | A1 | 12/2005 | Saito et al. | |
| 2008/0176366 | A1 | 7/2008 | Mita et al. | |

FOREIGN PATENT DOCUMENTS

| JP | 05102192 A | * 4/1993 | ............ H01L 21/338 |
|---|---|---|---|
| JP | 2001-102565 A | 4/2001 | |
| JP | 2006-5005 | 1/2006 | |
| JP | 2006-190991 | 7/2006 | |
| JP | 2008-124262 A | 5/2008 | |
| JP | 2008-227014 A | 9/2008 | |
| JP | 2008-258310 | 10/2008 | |

OTHER PUBLICATIONS

Machine translation of Nakada, JP 05-102192.*
Machine translation of Ueda et al., JP 2006-190991, Date Jul. 20, 2006.*
Office Action of Japanese Patent Application No. 2009-230878 dated Jan. 7, 2014 with Partial Translation.

* cited by examiner

*Primary Examiner* — Hsin-Yi Hsieh
(74) *Attorney, Agent, or Firm* — Fujitsu Patent Center (57) ABSTRACT

A compound semiconductor device includes an electron transit layer; an electron supply layer formed over the electron transit layer; a first recessed portion and a second recessed portion formed in the electron supply layer; a chemical compound semiconductor layer including impurities that buries the first recessed portion and the second recessed portion and covers over the electron supply layer; a source electrode formed over the chemical compound semiconductor layer which buries the first recessed portion; a drain electrode formed over the chemical compound semiconductor layer which buries the second recessed portion; and a gate electrode formed over the electron supply layer between the source electrode and the drain electrode, wherein, in the chemical compound semiconductor layer, a concentration of impurities included below the source electrode and the drain electrode is higher than a concentration of impurities included near the gate electrode.

6 Claims, 13 Drawing Sheets

COMPOUND SEMICONDUCTOR DEVICE AND MANUFACTURING METHOD

CROSS-REFERENCE TO RELATED APPLICATIONS

This application is based upon and claims the benefit of priority of the prior Japanese Patent Application No. 2009-230878, filed on Oct. 2, 2009, the entire contents of which are incorporated herein by reference.

FIELD

The embodiments discussed herein relate to a compound semiconductor device and the manufacturing method.

BACKGROUND

A compound semiconductor device, an AlGaN/GaN Field effect transistor (FET), has been developed by utilizing a heterojunction of AlGaN/GaN, which is a nitride type compound semiconductor, and using a GaN layer as an electron transit layer. The GaN is a material that provides a wide bandgap, high breakdown electric field strength, and a high saturation electron velocity. Therefore, the GaN is a promising material for a semiconductor device that achieves a high voltage operation, a low on-resistance, and a high output.

Related techniques are discussed in, Japanese Laid-open Patent Publication Nos. 2008-124262, 2001-102565, and 2008-227014.

Generally, in order to achieve a high efficiency switching operation using a transistor, reducing an on-resistance of the transistor is desired.

Figure 1:
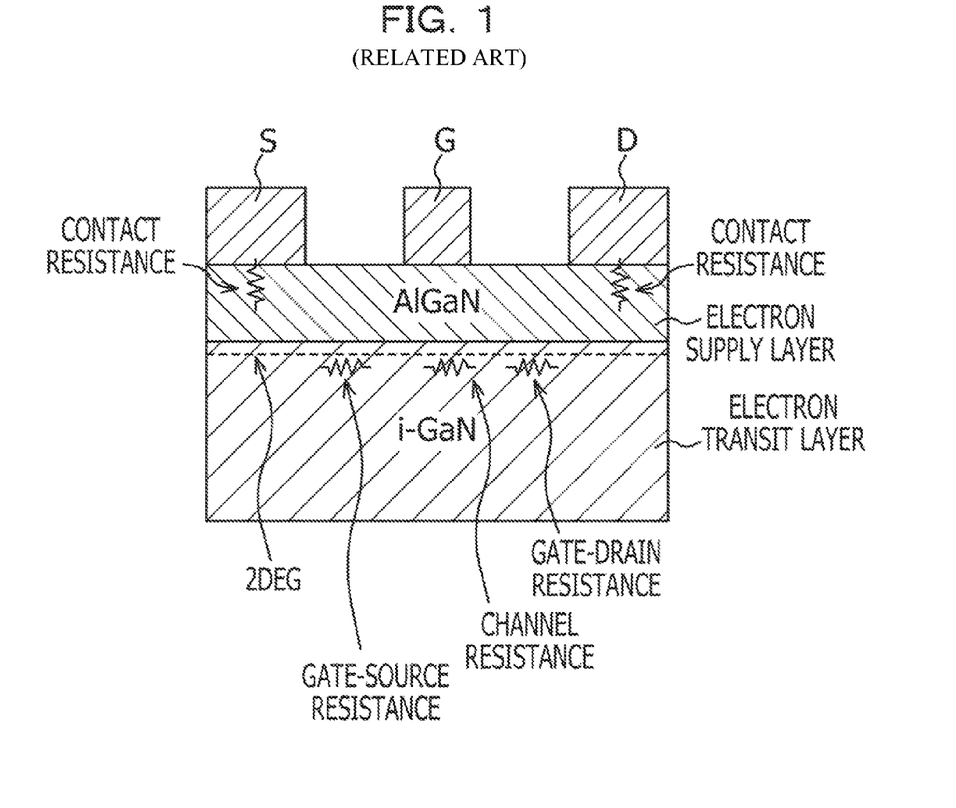
FIG. 1 illustrates on-resistance in an AlGaN/GaN FET.

The on-resistance in the AlGaN/GaN FET will be described by referring to FIG. 1. In the AlGaN/GaN FET, contact-resistances exist at a source electrode S, a drain electrode D, and an AlGaN electron supply layer that is a lower layer of the source electrode S and the drain electrode D. In two-dimensional electron gas (2DEG) generated in an electron transit layer near an interface to the electron supply layer, mainly, gate-source resistance, gate-drain resistance, and a channel resistance below a gate electrode G exist. A sum of the contact resistance, the gate-source resistance, the gate-drain resistance and the channel resistance is substantially equal to the on-resistance.

In the AlGaN/GaN FET, increasing Al composition of the AlGaN layer decreases the channel resistance. On the other hand, higher Al composition makes a barrier higher, thereby contact resistance of the source electrode and the drain electrode increases. The increase of the contact resistance is significant and the on-resistance includes the contact resistance and the channel resistance as the constituents, and the on-resistance is not reduced as a whole, and sometimes may even increase. In this case, a high efficiency operation of the AlGaN/GaN FET is difficult.

SUMMARY

According to an aspect of the invention, a compound semiconductor device includes an electron transit layer; an electron supply layer formed over the electron transit layer; a first recessed portion and a second recessed portion formed in the electron supply layer; a chemical compound semiconductor layer including impurities that buries the first recessed portion and the second recessed portion and covers over the electron supply layer; a source electrode formed over the chemical compound semiconductor layer which buries the first recessed portion; a drain electrode formed over the chemical compound semiconductor layer which buries the second recessed portion; and a gate electrode formed over the electron supply layer between the source electrode and the drain electrode, wherein, in the chemical compound semiconductor layer, a concentration of impurities included below the source electrode and the drain electrode is higher than a concentration of impurities included near the gate electrode.

According to an another aspect of the invention, a compound semiconductor device manufacturing method includes forming an electron supply layer over an electron transit layer; forming a first recessed portion and a second recessed portion in the electron supply layer; covering the first recessed portion, the second recessed portion, and the electron supply layer with a compound semiconductor layer so that a concentration of impurities included below a source electrode and a drain electrode is higher than a concentration of impurities included near a gate electrode; forming the source electrode over the compound semiconductor layer to bury the first recessed portion; forming the drain electrode over the compound semiconductor layer to bury the second recessed portion; and forming the gate electrode over the electron supply layer between the source electrode and the drain electrode.

The object and advantages of the invention will be realized and attained by at least the features, elements, and combinations particularly pointed out in the claims.

It is to be understood that both the foregoing general description and the following detailed description are exemplary and explanatory and are not restrictive of the invention, as claimed.

DESCRIPTION OF EMBODIMENTS

In the figures, dimensions and/or proportions may be exaggerated for clarity of illustration. It will also be understood that when an element is referred to as being "connected to" another element, it may be directly connected or indirectly connected, i.e., intervening elements may also be present. Further, it will be understood that when an element is referred to as being "between" two elements, it may be the only element layer between the two elements, or one or more intervening elements may also be present.

In embodiments that will be described hereinafter, an AlGaN/GaN FET will be provided as an example of a compound semiconductor device. As the compound semiconductor device, other than the AlGaN/GaN FET, a nitride semiconductor device such as InAlN and InAlGaN may be applied.

Figure 2A:
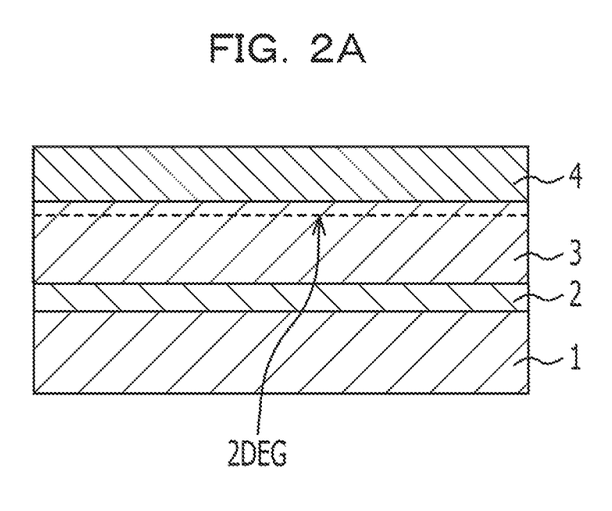
FIGS. 2A to 2I are sectional views illustrating a manufacturing method of a compound semiconductor device according to a first embodiment.

As illustrated in FIG. 2A, a nucleation layer 2, an electron transit layer 3, and an electron supply layer 4 are formed over a substrate 1. In a compound semiconductor device, two-dimensional electron gas (2DEG) is generated in the electron transit layer 3 near an interface to the electron supply layer 4. The 2DEG is indicated by a dashed line in FIG. 2A and figures thereafter.

Compound semiconductor layers that will be described hereinafter are grown over a SiC substrate 1, for example, with a Metal Organic Vapor Phase Epitaxy (MOVPE) by using a crystal growth apparatus.

For example, intentionally undoped AlN (i-AlN), intentionally undoped GaN (i-GaN), and intentionally undoped AlGaN (i-AlGaN) are formed as the nucleation layer 2, the electron transit layer 3, and the electron supply layer 4 respectively. For example, a film thickness of the nucleation layer 2 is about 0.1 μm. A film thickness of the electron transit layer 3 is about 3 μm. A film thickness of the electron supply layer 4 is, for example, about 20 nm when an $Al_xGa_{1-x}N$ (0<x<1) is, for example, $Al_{0.25}Ga_{0.75}N$.

Conditions to grow i-AlN, i-GaN, and i-AlGaN are described below. For example, as material gas, mixed gas made up of trimethylaluminum gas, trimethylgallium gas, and ammonia gas is used and according to a compound semiconductor layer to be grown, supply and non-supply, and a flow amount of trimethylaluminum gas that is a source of Al, and trimethylgallium gas that is a source of Ga are set. A flow amount of ammonia gas that is a common material is, for example, about 100 ccm to 10 LM. Moreover, growth pressure is for example, 50 Torr to 300 Torr and the growth temperature is for example, 1,000 deg. C. to 1,250 deg. C.

Figure 2B:
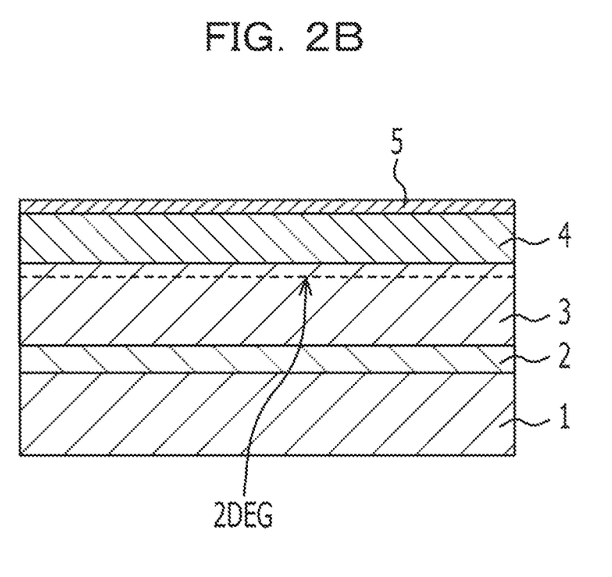

As illustrated in FIG. 2B, an insulating film 5 is formed.

The insulating film 5 is formed over the electron supply layer 4 by In-situ using the crystal growth apparatus subsequently that formed the nucleation layer 2, the electron transit layer 3, and the electron supply layer 4. The insulating film 5 is, for example, a silicon nitride film with a film thickness of about 50 nm. After that, the SiC substrate 1 is taken out of the crystal growth apparatus.

Instead of the In-situ using the crystal growth apparatus, the insulating film 5 may be formed by a Chemical Vapor Deposition (CVD) method, an Atomic Layer Deposition (ALD) method, a deposition method, and a sputtering, for example. When the insulating film is formed by any one of the methods, the insulating film is formed by using a certain deposition device after taking out the SiC substrate 1 from the crystal growth apparatus subsequent to forming the electron supply layer 4.

Figure 2C:
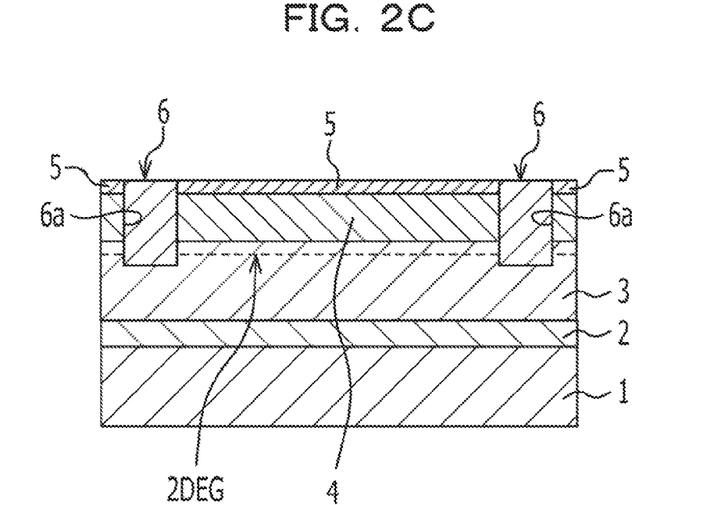

As illustrated in FIG. 2C, an element isolation structure 6 is formed by a Shallow Trench Isolation (STI) method.

By applying lithography and a dry-etching using chlorine gas for example, an isolation trench 6a is formed in an element isolation region over the insulating film 5 by penetrating the insulating film 5 and the electron supply layer 4 with a depth that removes a part of the electron transition layer 3.

A silicon oxide is deposited over the insulating film 5 so as to bury the isolation trench 6a, for example, by a CVD method. The silicon oxide over the insulating film 5 is removed by polishing by utilizing a difference between a polishing rate of silicon nitride and that of silicon oxide. At approximately the same time, an element isolation structure 6 that fills the isolation trench 6a is formed. As a result, the remaining region over the electron supply layer 4 becomes an active region.

Instead of forming the isolation trench 6a and filling insulator in the isolation trench 6a, a method may be used in which impurities are ion-implanted to the element isolation region, making a portion of the electron supply layer 4 and the electron transition layer 3 in the element isolation region an insulated state.

Figure 2D:
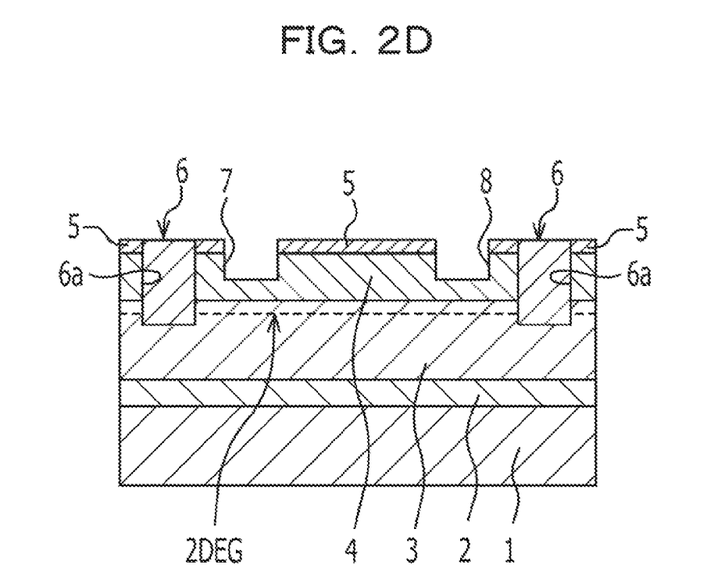

As illustrated in FIG. 2D, a recessed portion 7 and a recessed portion 8 are formed in portions where the source electrode and the drain electrode are to be formed.

The recessed portion 7 and the recessed portion 8 are formed by applying lithography and a dry-etching using, e.g., chlorine gas to the portions where the source electrode and the drain electrode are to be formed over the insulating film 5 so as to penetrate the insulating film 5 and to reach a certain depth of the electron supply layer 4.

As conditions for the dry-etching, for example, chorine is used with a flow amount of about 30 sccm, pressure is about 2 Pa, and RF input power is about 20 W. The etching depth is not limited and may be a depth that forms the recessed portions 7 and 8 reaching a certain depth of the electron supply layer 4.

A resist used by dry-etching is removed, for example, by ashing.

Figure 2E:
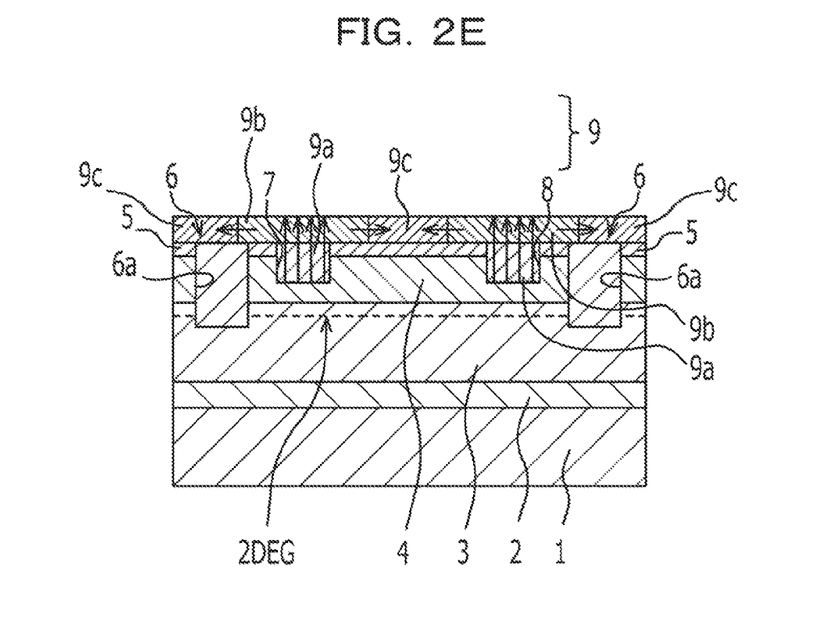

As illustrated in FIG. 2E, an n-GaN layer 9 that buries the recessed portions 7 and 8 and covers the electron supply layer 4 is formed.

The SiC substrate 1 is put into the crystal growth apparatus, and the n-GaN layer 9 is continuously grown, for example, with a MOVPE method by gradually decreasing an amount of impurities, for example, n-type impurities to be added. As indicated by arrows in FIG. 2E, crystal growth of the n-GaN progresses from the bottom of the recessed portions 7 and 8 upwardly, and after growing so as to fill the recessed portions 7 and 8, the crystal growth progresses over the electron supply layer 4 toward lateral direction to form the n-GaN layer 9 that buries the recessed portions 7 and 8 and covers the electron supply layer 4.

As material gas for growing the n-GaN layer 9, in addition to mixed gas made up of trimethylgallium gas (Ga source) and ammonia gas, for example, diluted $SiH_4$ is supplied with a flow amount of a few ccm, and for example, Si is added as n-type impurities. For example, a flow amount of trimethylgallium gas is about 5 ccm to 50 ccm, and a flow amount of ammonia gas is 100 ccm to 10 LM, and processing temperature is gradually increased from 900 deg. C. to 1,250 deg. C. from the start to the end of the growth, and a flow amount of $SiH_4$ is adjusted so that the amount of Si to be added is gradually decreased in a range of carrier concentrations of $1 \times 10^{17}/cm^3$ to $5 \times 10^{19}/cm^3$.

Decreasing an amount of Si to be added may be controlled so as to decrease with a substantially constant rate from the start to the end of the growth. However, according to the embodiment, for example, the amount of Si is added in three stages. The first stage is from the start of the growth until the recessed portions 7 and 8 are buried. The second stage is growing the n-GaN layer 9 laterally over the electron supply layer 4 before reaching a portion where the gate electrode is to be formed. The third stage is growing the n-GaN layer 9 laterally so as to cover the electron supply layer 4 completely beyond the portion where the gate electrode is to be formed. The amount of Si to be added is assumed to be substantially constant in each of the stages, and is adjusted to be as follows: the amount of Si to be added in the first stage>the amount of Si to be added in the second stage>the amount of Si to be added in the third stage. For example, the amount of Si to be added is: $1 \times 10^{19}/cm^3$ to $3 \times 10^{19}/cm^3$ in the first stage, $1 \times 10^{18}/cm^3$ to $1 \times 10^{19}/cm^3$ in the second stage, and $1 \times 10^{17}/cm^3$ to $1 \times 10^{18}/cm^3$ in the third stage. In the n-GaN layer 9, a portion grown in the first stage is illustrated as a first n-GaN region 9a, a portion grown in the second stage is illustrated as a second n-GaN region 9b, and a portion grown in the third stage is illustrated as a third n-GaN region 9c.

Increasing a processing temperature may be controlled so as to increase in a substantially constant rate from the start to the end of the growth. However, according to the embodiment, temperature is adjusted by corresponding to the three stages as described above. For example, the processing temperature is substantially constant in each of the stages and adjusted to be as follows: Processing temperature of the first stage<Processing temperature of the second stage<Processing temperature of the third stage. For example, the processing temperature may be about 900 deg. C. to 1,100 deg. C. in the first stage, about 1,100 deg. C. to 1,180 deg. C. in the second stage, and about 1,180 deg. C. to 1,250 deg. C. in the third stage.

Note that the processing temperature may be maintained substantially constant and typically an amount of Si to be added may be adjusted.

By adjusting, in an increasing manner, the processing temperature as described above, a dislocation state (the number of dislocations) of the n-GaN layer 9 is controlled. Higher processing temperature may decrease the number of dislocations of the N-GaN layer 9 more. In the first n-GaN region 9a grown in the first stage, the growth starts from a face of the AlGaN at the bottom of the recessed portions 7 and 8 and the processing temperature is low. Thus, the number of dislocations may be larger than that of the second GaN region 9b and the third n-GaN region 9c that are grown later than the first n-GaN region 9a.

Figure 2F:
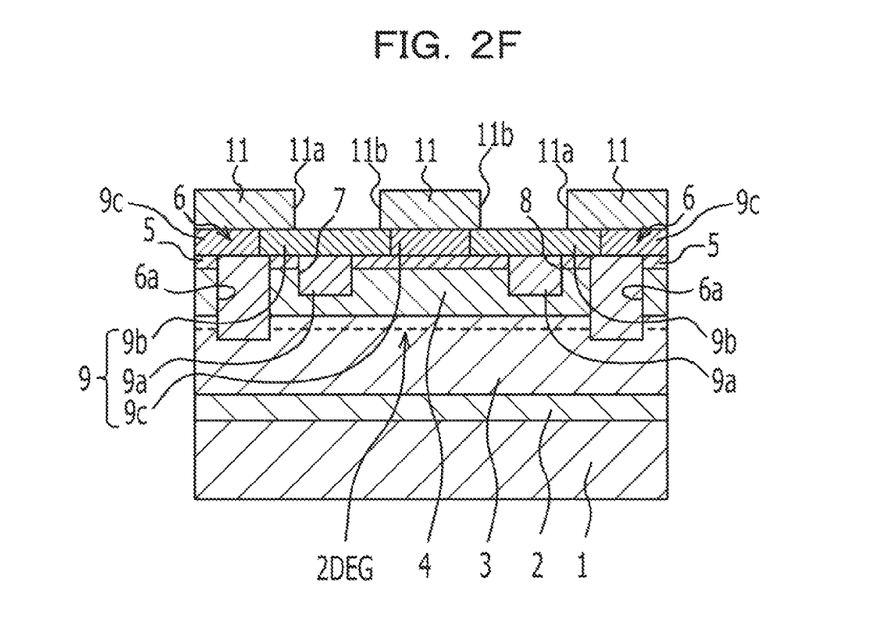

As illustrated in FIG. 2F, a resist pattern 11 for forming the source electrode and the drain electrode is formed.

A resist is applied to a whole surface of the n-GaN layer 9 and a resist pattern 11 is formed by lithography with openings 11a at portions where the source electrode and the drain electrode in an active region are to be formed. In the resist pattern 11, the opening 11a is formed so that an end 11b at a side of a portion where the gate electrode is to be formed is formed biased to the portion where the gate electrode is to be formed with respect to the recessed portions 7 and 8.

Figure 2G:
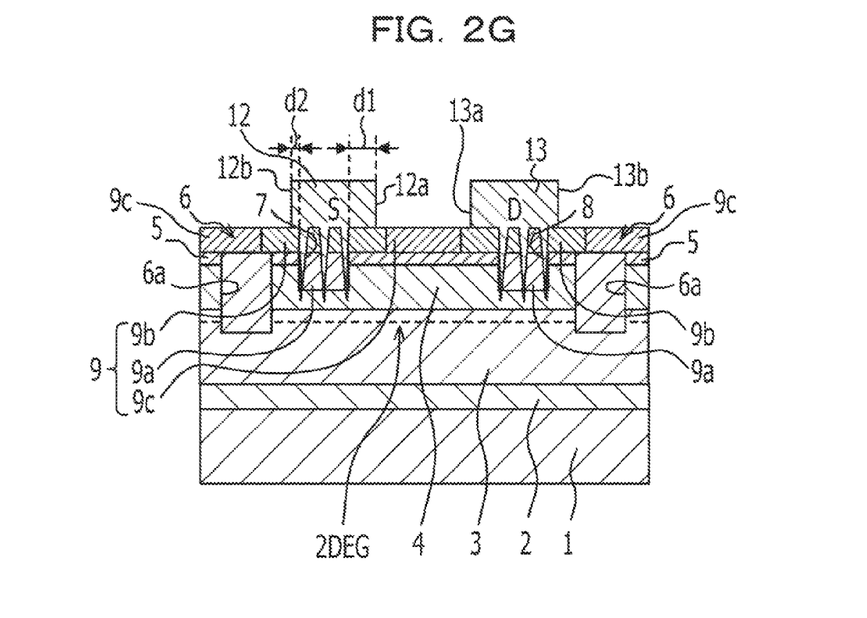

As illustrated in FIG. 2G, the source electrode 12 and the drain electrode 13 are formed.

As materials for the electrodes, for example, Ta, Al, M, and Au are used and the source electrode 12 and the drain electrode 13 are formed, for example, by a deposition method over the resist pattern 11 so as to bury the opening 11a. The M is one of metals selected from Ti, Ta, Ni, Mo, and Pt and here, for example, Ni. As materials for the source electrode 12 and the drain electrode 13, Ti/Al may be used. By using warmed organic solvent, for example, the resist pattern 11 is removed with a lift-off method together with the Ta, Al, Ni, and Au over the resist pattern 11. An annealing treatment is applied to the SiC substrate 1, for example, at about 550 deg. C. Through the above described processes, the source electrode 12 and the drain electrode 13 that are a pair of ohmic electrodes made up of a lamination of Ta/Al/M/Au over the n-GaN layer 9 are formed.

The source electrode 12 and the drain electrode 13 are formed so that an end 12a and an end 13a at sides of a portion where the gate electrode is to be formed are formed biased to the portion where the gate electrode is to be formed with respect to the recessed portions 7 and 8. According to the embodiment, a distance d1 between the end 12a of the source electrode 12 at the side of the portion where the gate electrode is to be formed and the recessed portion 7 in the horizontal direction is about 0.05 µm to 1.2 µm, for example. Furthermore, for example, a distance d1 between the end 13a of the drain electrode 13 at the side of the portion where the gate electrode is to be formed and the recessed portion 8 in the horizontal direction is also about 0.05 µm to 1.2 µm. Moreover, a distance d2 between the other end 12b of the source electrode and the recessed portion 7 in the horizontal direction is about 0.05 µm to 0.5 µm, for example. Furthermore, a distance d2 between the other end 13b of the drain electrode 13 and the recessed portion 8 in the horizontal direction is also about 0.05 µm to 0.5 µm, for example.

In the n-GaN layer 9, the number of dislocations of the first n-GaN region 9a is greater than that of the second n-GaN region 9b and that of the third n-GaN region 9c. Thus, as illustrated, by the above annealing treatment, some of the Ta, Al, Ni, and Au that are materials for the source electrode 12 and the drain electrode 13 diffuse into the first n-GaN region 9a through dislocations of the first n-GaN region 9a which exists below the source electrode 12 and the drain electrode 13, and further diffuse into the electron supply layer 4. As described above, diffusion of a portion of the materials for the source electrode 12 and the drain electrode 13 into the first n-GaN region 9a and the electron supply layer 4 improves ohmic properties of the source electrode 12 and the drain electrode 13.

Figure 2H:
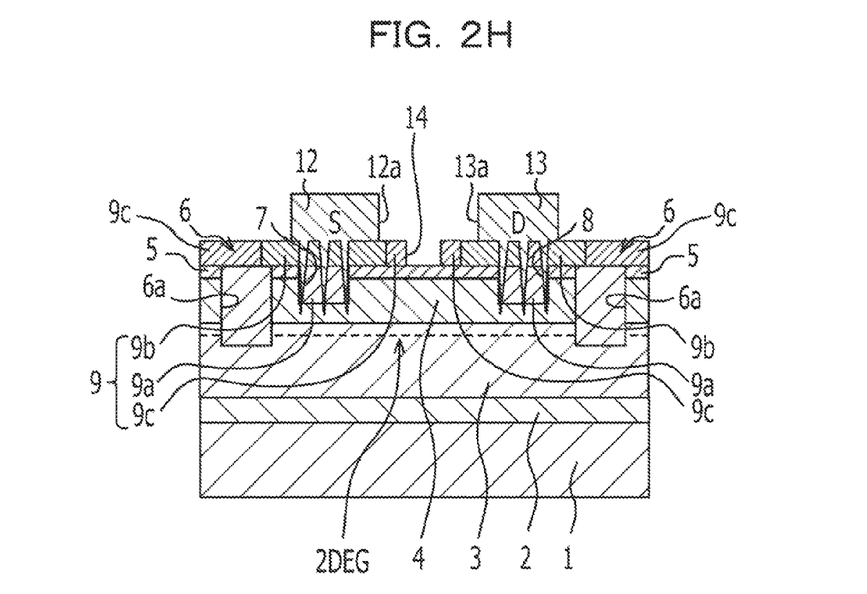

As illustrated in FIG. 2H, an opening 14 is formed in the portion where the gate electrode is to be formed in the third n-GaN region 9c of the n-GaN layer 9.

For example, a resist is applied over an entire surface of n-GaN layer 9 and a resist mask (not illustrated) for opening and exposing the portion where the gate electrode is to be formed in the third n-GaN region 9c is formed by lithography. By using the resist mask, the portion where the gate electrode is to be formed in the third n-GaN region 9c is dry-etched using, e.g., chlorine gas. Accordingly, the opening 14 that exposes the portion where the gate electrode is to be formed over the surface of the insulating film 5 is formed over the third n-GaN region 9c of the n-GaN layer 9.

The resist used for the dry-etching is removed by ashing, for example.

Figure 2I:
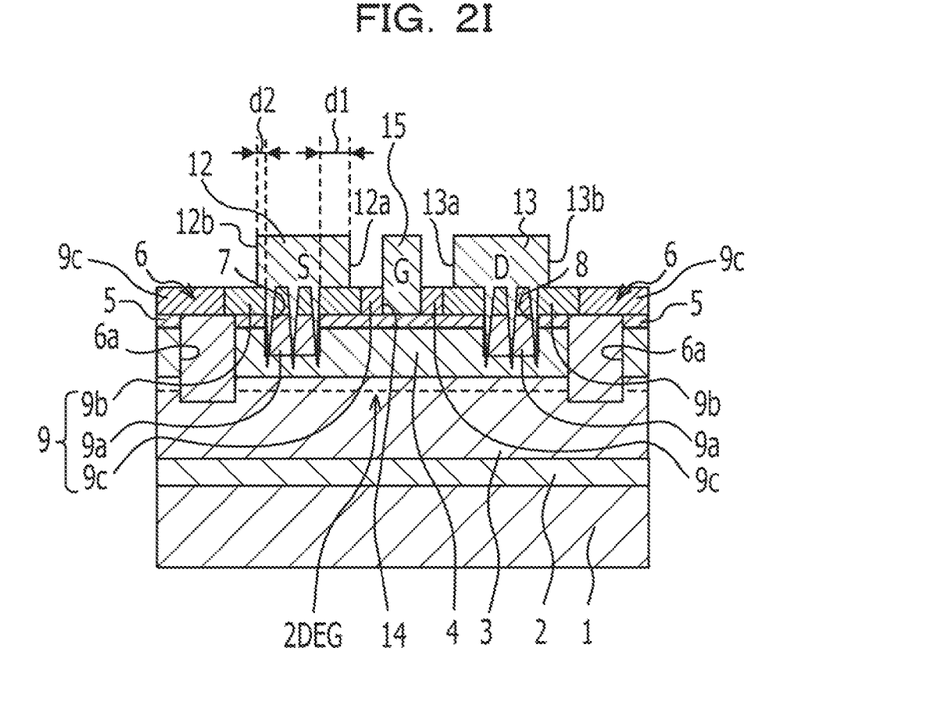

As illustrated in FIG. 2I, a gate electrode 15 is formed.

For example, materials for the gate electrode, such as Ni/Au are laminated over the resist mask so as to bury the opening 14. The resist mask is removed together with the Ni/Au over the resist mask with a lift-off method by using warmed organic solvent, for example. Accordingly, the gate electrode 15 that is made up of Ni/Au is formed by filling the opening 14 over the insulating film 5 and projecting above the third n-GaN region 9c. The gate electrode 15 is formed over the electron supply layer 4 through the insulating film 5 that functions as a gate insulating film.

An AlGaN/GaN FET is formed after forming, e.g., an interlayer dielectric film and wirings.

Instead of forming the gate electrode 15 in the middle between the source electrode 12 and the drain electrode 13, the gate electrode 15 may be formed at a position biased to the side of the source electrode 12 between the source electrode 12 and the drain electrode 13.

Figure 3:
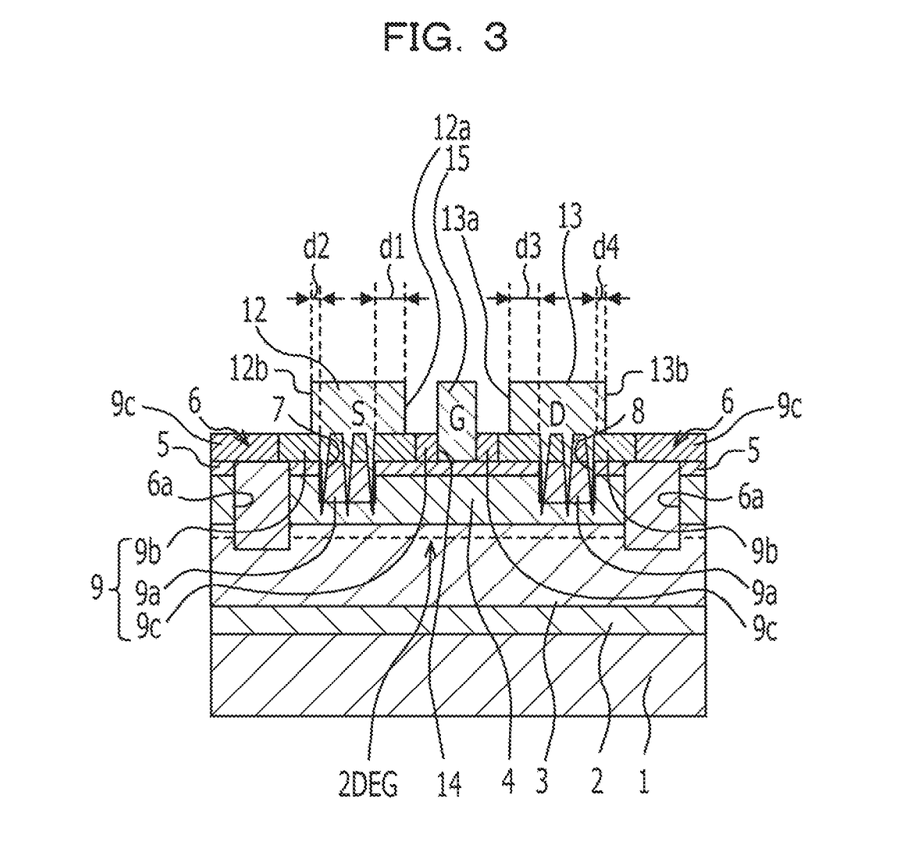
FIG. 3 is a sectional view illustrating another example of a compound semiconductor device according to a first embodiment.

For example, as illustrated in FIG. 3, after forming the opening 14 of the third n-GaN region 9c at a portion biased to the side of the source electrode 12, the opening 14 is filled over the insulating film 5 and the gate electrode 15 projecting above the third n-GaN region 9c is formed. In this case, as in FIG. 2G, as for the source electrode 12, a distance d1 between the end 12a of the source electrode 12 at a side of the gate electrode 15 and the recessed portion 7 in the horizontal direction is about 0.05 µm to 1.2 µm, for example. Moreover, the distance d2 between the other end 12b of the source electrode 12 and the recessed portion 8 in the horizontal direction, for example, is about 0.05 µm to 0.5 µm. As for the drain electrode 13, a distance d3 between the end 13a at the side of the gate electrode 15 and the recessed portion 8 in the horizontal direction is greater than the d1, and about 0.05 µm to 10 µm, for example. A distance d4 between the other end 13b of the drain electrode 13 and the recessed portion 8 in horizontal direction is substantially the same as the d2.

By forming the gate electrode 15 at the position offset to the side of the source electrode 12 (asymmetry position), a withstanding voltage of the gate may be increased. Moreover, increase in on-resistance may be suppressed by forming the gate electrode 15 so as to extend toward the drain electrode 15 in accordance with the offset of the gate electrode 15.

In FIG. 2I, the source electrode 12 and the drain electrode 13 are formed over the n-GaN layer 9 that does not include Al, and a barrier is lower compared with when the electrodes are formed over the AlGaN layer. Thus, the contact resistance of the source electrode 12 and the drain electrode 13 is reduced. The n-GaN layer 9 includes Si that is n-type impurities, and the Si concentration is high in the first n-GaN region 9a that exists below the source electrode 12 and the drain electrode 13, and the first n-GaN region 9a with the high Si concentration further reduces the contact resistance. When the Si concentration is high in the n-GaN between the gate-source and the gate-drain, leak path may be caused between the gate-source and the gate-drain. According to the embodiment, the second n-GaN region 9b and the third n-GaN region 9c are formed between the gate-source and the gate-drain and the Si concentrations of the second n-GaN region 9b and the third n-GaN region 9c are lower than the Si concentration of the first n-GaN region 9a. Moreover, the Si concentration of the third n-GaN region 9c with one end is in contact with the gate electrode 15 is lower than the Si concentration of the n-GaN region 9b. The configuration allows a leak path between the gate-source and the gate-drain to be suppressed.

The end 12a of the source electrode 12 and the end 13a of the drain electrode 13 are formed biased to a side of the gate electrode 15 asymmetrically with respect to the recessed portions 7 and 8. The end 12a of the source electrode 12 and the end 13a of the drain electrode 13 that are projecting toward the side of the gate electrode 15 will be described below. In the AlGaN/GaN FET, among two-dimensional electron gas (2DEG) generated in the electron transit layer 3 near the interface to the electron supply layer 4, the concentration is high below the 12b of the source electrode 12 and 13b of the drain electrode 13, thereby electrons move easily. Thus, the gate-source resistance and the gate-drain resistance are reduced.

The embodiment suppresses a leak path between the gate-source and between the gate-drain, reduces the contact resistance of the source electrode 12 and the drain electrode 13, and also reduces the gate-source resistance and the gate drain resistance. The on-resistance is evaluated as a sum of the contact resistance, the gate-source resistance, and the gate-drain resistance. Thus, the on-resistance of the AlGaN/GaN FET is significantly reduced. As described above, the source electrode 12 and the drain electrode 13 are formed with a state in which some of the materials diffused to the lower layer. Hence, the ohmic properties are improved and contribute to further reduce the contact resistance.

Figure 4:
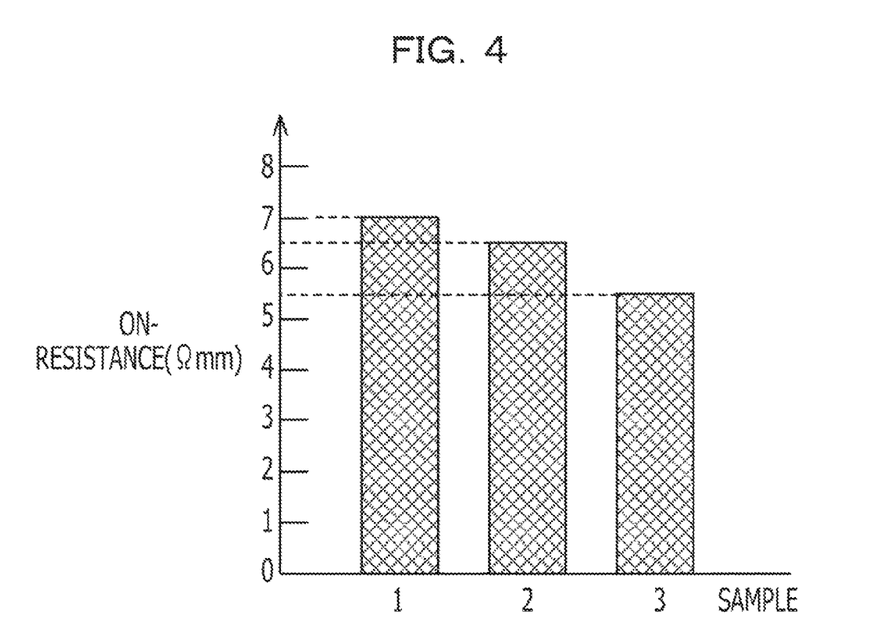
FIG. 4 is a characteristic chart illustrating on-resistance.

By referring to FIG. 4, an example of an experiment of the on-resistance of the AlGaN/GaN FET according to the embodiment will be described by comparing with the conventional AlGaN/GaN FET in which a source electrode and a drain electrode are formed over an electron supply layer of AlGaN.

An experiment was conducted for a case in which Al composition in AlGaN in an electron supply layer is a certain value, for example 30%. In FIG. 4, a sample 1 indicates a conventional AlGaN/GaN FET, a sample 2 indicates an AlGaN/GaN FET according to the embodiment with a structure in which the source electrode 12 and the drain electrode 13 are formed without being biased to the gate electrode 15, and a sample 3 indicates the AlGaN/GaN FET according to the embodiment.

The on-resistance of the sample 1 is about 7 Ωmm, that of the sample 2 is about 6.3 Ωm, and that of the sample 3 is about 5.4 Ωmm. As described above, the on-resistance of the samples 2 and 3 is reduced more than that of the sample 1. Moreover, the on-resistance of the sample 3 is reduced more than the on-resistance of the sample 2. Based on the result, the on-resistance of the sample 2 is improved because the contact resistance of the sample 2 is reduced more compared with the sample 1. It is observed that the on-resistance of the sample 3 is significantly improved because, in the sample 3, the contact resistance, and both the gate-source resistance and the gate-drain resistance are reduced.

As described above, according to the embodiment, the AlGaN/GaN FET is obtained that may significantly reduce the on-resistance, provide good ohmic properties, and achieve a sufficiently high voltage operation and a high power with high reliability.

According to a second embodiment, the compound semiconductor device is disclosed as in the first embodiment, but with a gate-recess structure in which a gate electrode is buried in a trench formed in an electron supply layer while the gate electrode is projected above. The AlGaN/GaN FET with a gate-recess structure achieves a normally-off operation in which substantially no current flows with an applied voltage is off. The normally-off operation is preferable for a switching element that is used for a power supply and the AlGaN/GaN FET according to the embodiment is mainly used for a power supply circuit.

Figure 5A:
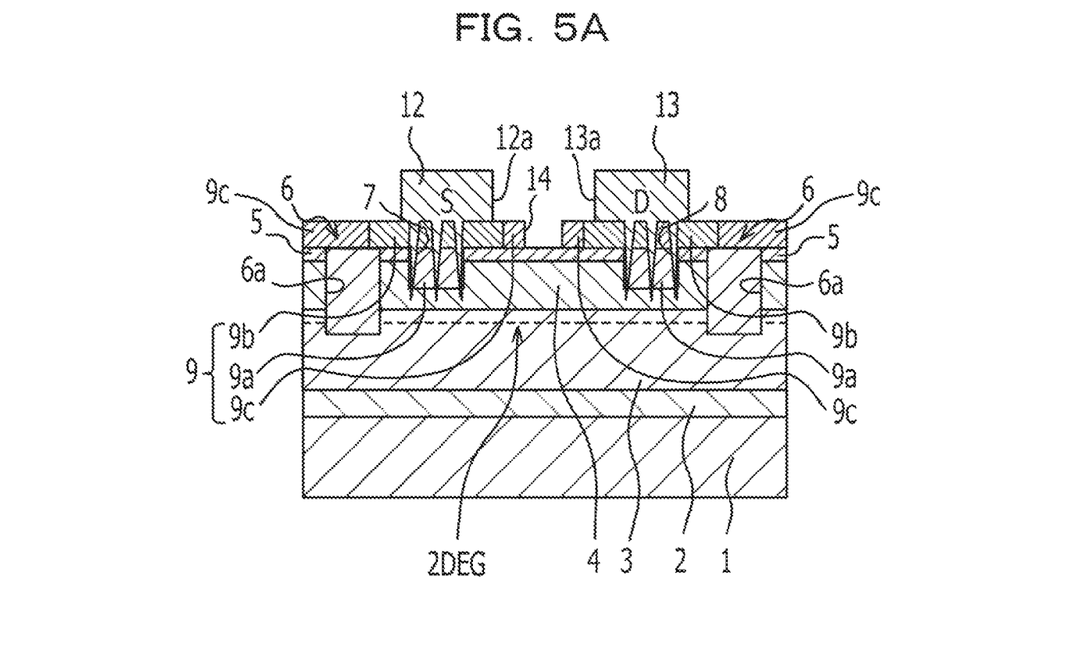
FIGS. 5A to 5E are sectional views illustrating a manufacturing method of a compound semiconductor device according to a second embodiment.

According to the second embodiment, substantially the same processes as those illustrated in FIG. 2A to FIG. 2H are performed and as illustrated in FIG. 5A, substantially the same structure as that of FIG. 2H is obtained.

Figure 5B:
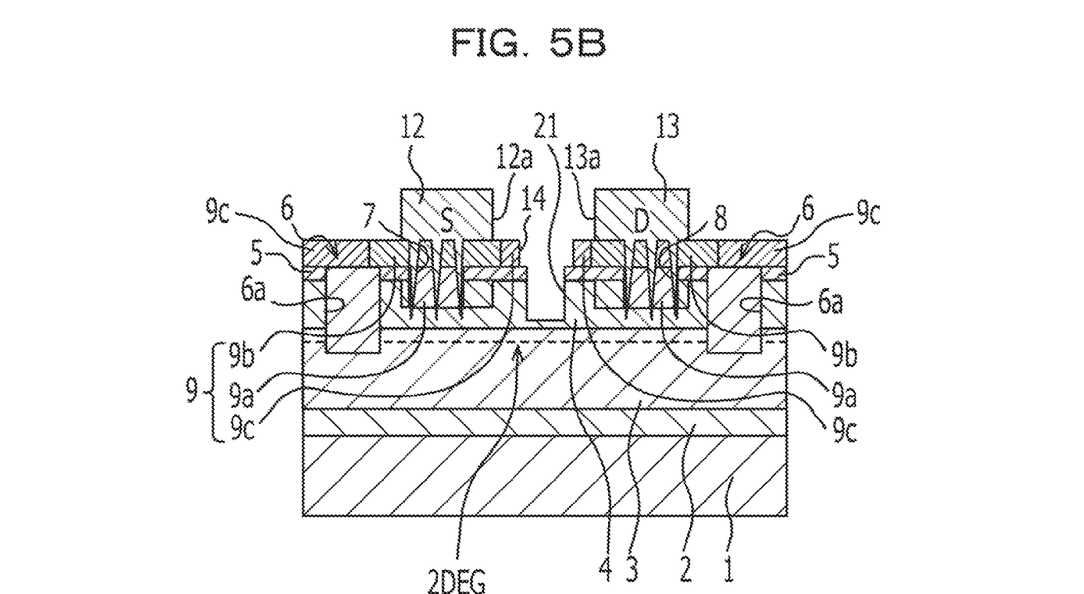

As illustrated in FIG. 5B, a recessed portion 21 is formed in an insulating film 5 that is exposed at a bottom surface of a formed opening 14 so as to reach a certain depth in an electron supply layer 4 that is a lower layer of the insulating film 5.

The recessed portion 21 is formed to the insulating film 5 exposed at the bottom surface of the opening 14 by lithography and dry-etching so as to penetrate the insulating film 5 and to reach the certain depth of the electron supply layer 4.

The resist used by the lithography is removed, for example, by ashing or peeling.

Figure 5C:
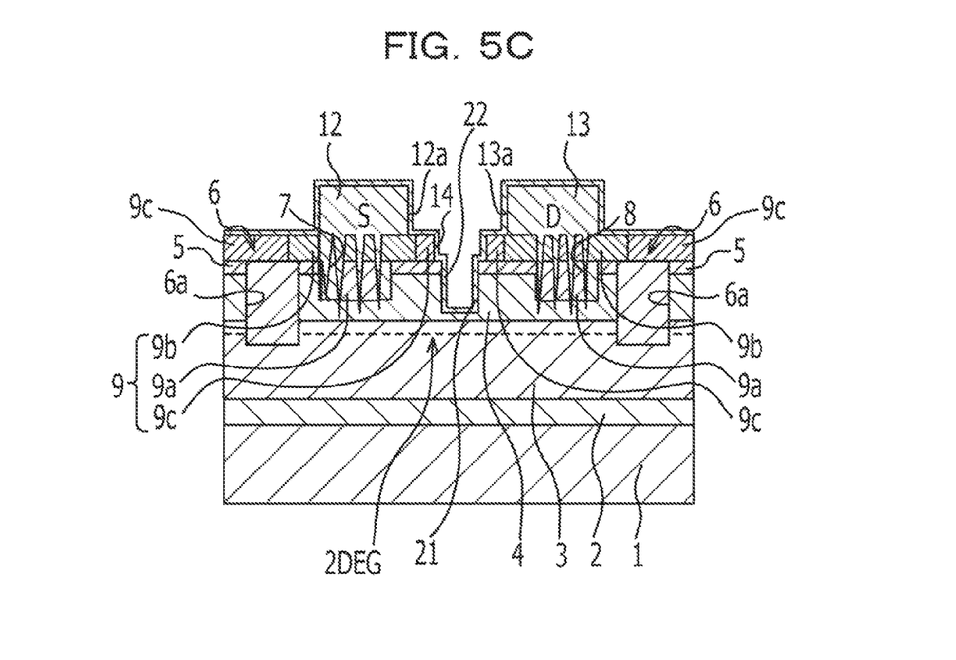

As illustrated in FIG. 5C, an insulating film 22 is formed above a substrate 1 that includes an inner wall face of the recessed portion 21.

An insulating material such as SiN with a film thickness of about 50 nm is deposited above the substrate 1 so as to cover the inner wall face of the recessed portion 21, for example. As a result, the insulating film 22 that becomes a gate insulating film is formed over the inner wall face of the recessed portion 21.

Figure 5D:
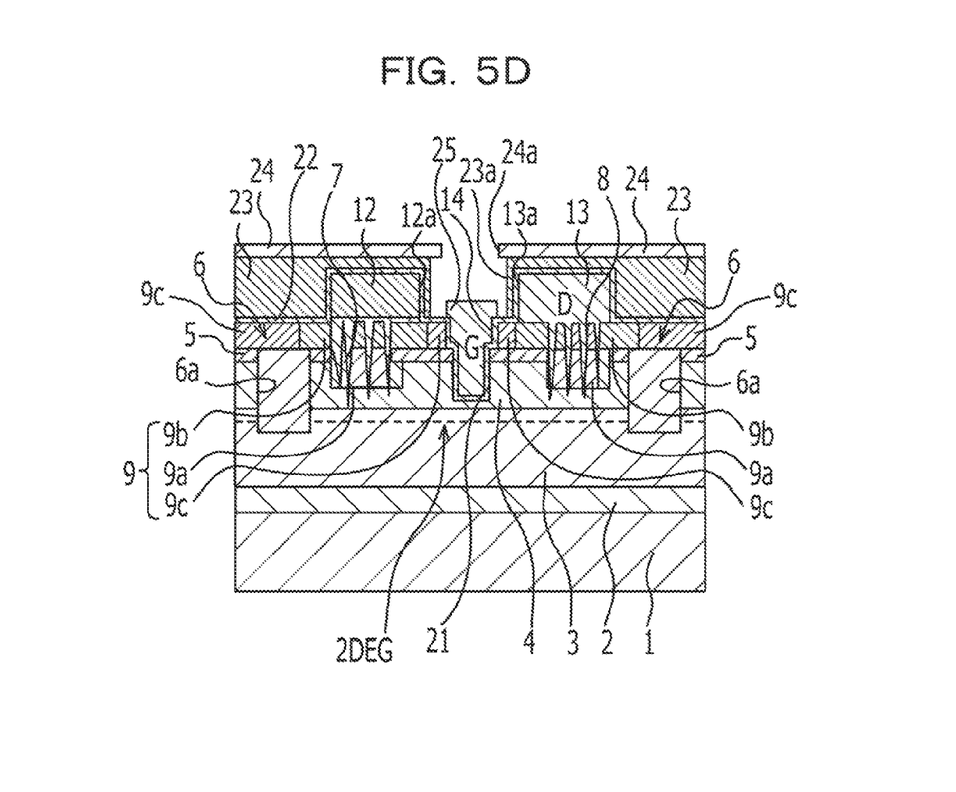
Figure 5E:
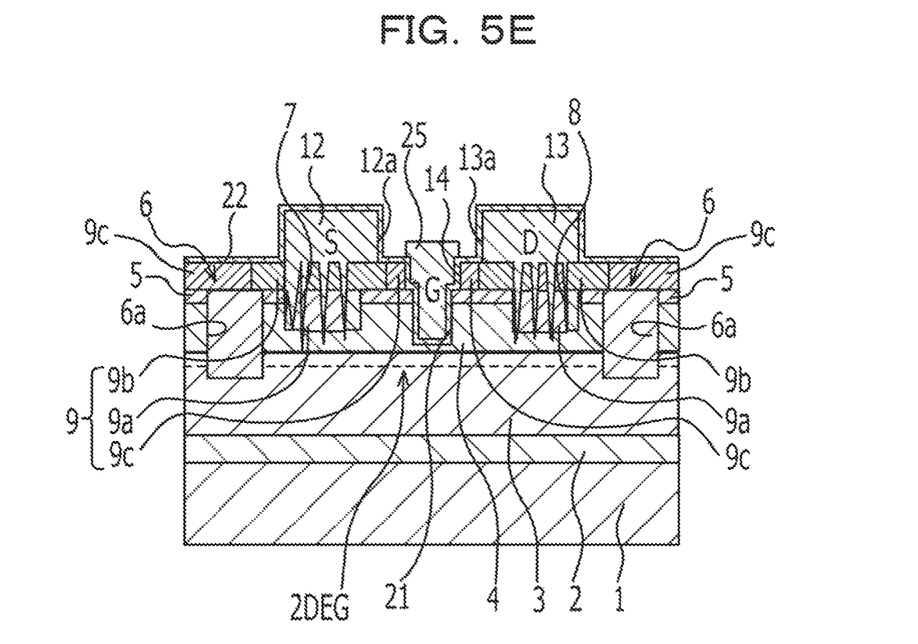

As illustrated in FIGS. 5D and 5E, a gate electrode 25 is formed.

As illustrated in FIG. 5D, a lower layer resist 23 (for example, PMGI manufactured by MicroChem Corporation, USA) and an upper layer resist 24 (for example, PFI32-A8 manufactured by Sumitomo Chemical Co., Ltd.) are formed by coating, for example with a spin coating method. An opening 24a with a diameter of, for example, about 0.8 µm is formed in the upper layer resist 24 by ultraviolet ray exposure.

The lower layer resist 23 is wet-etched with an alkaline developer by using the upper layer resist 24 as a mask. The etching forms an opening 23a in the lower layer resist 23 that is larger than the opening 24a, and an eave-like structure as illustrated is formed.

Gate metal (for example, Ni with a film thickness of about 10 nm/Au with a film thickness of about 300 nm) is deposited over an entire surface of substrate 1 including in the opening 24a and the opening 23a by using the upper layer resist 24 and the lower layer resist 23 as masks. For convenience of illustration, the gate metal deposited over the upper layer resist 24 is not illustrated.

As illustrated in FIG. 5E, for example, the lower layer resist 23, the upper layer resist 24, and the gate metal over the upper layer resist 24 are removed with a lift-off by using, for example, warmed organic solvent. Accordingly, the gate electrode 25 of Ni/Au is formed that fills the recessed portion 21 and the opening 14 through the insulating film 22 and projects above the third n-GaN region 9c.

After that, the AlGaN/GaN FET is formed through forming an interlayer dielectric film and wirings, for example.

As described above, according to the embodiment, the AlGaN/GaN FET is obtained that may significantly reduce on-resistance, provide good ohmic properties, and achieve a sufficiently high voltage operation and a high power. Moreover, the AlGaN/GaN FET may be preferably applied to an electric circuit for supplying a high power with high reliability.

According to the second embodiment, an example of an insulating gate type AlGaN/GaN FET is provided in which the gate insulating film 23 is provided between the electron supply layer 4 and the gate electrode 25. According to an alternative embodiment, a schottky type AlGaN/GaN FET that does not include a gate insulating film between the electron supply layer 4 and the gate electrode 25 is provided as an example.

According to the alternative embodiment, substantially the same processes as those illustrated in FIGS. 2A to 2H according to the first embodiment are performed and substantially the same state as that illustrated in FIG. 2H is obtained.

Figure 6A:
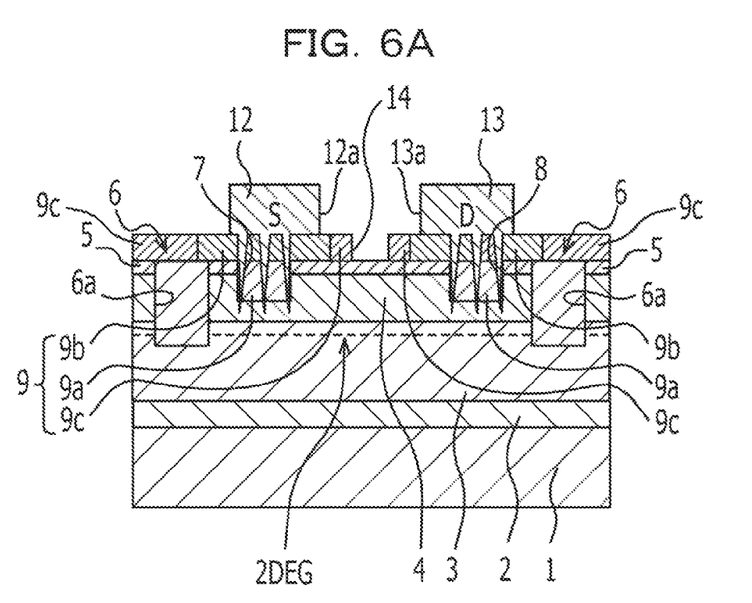
FIGS. 6A to 6D are sectional views illustrating a manufacturing method of a compound semiconductor device according to an alternative embodiment of a second embodiment.
Figure 6B:
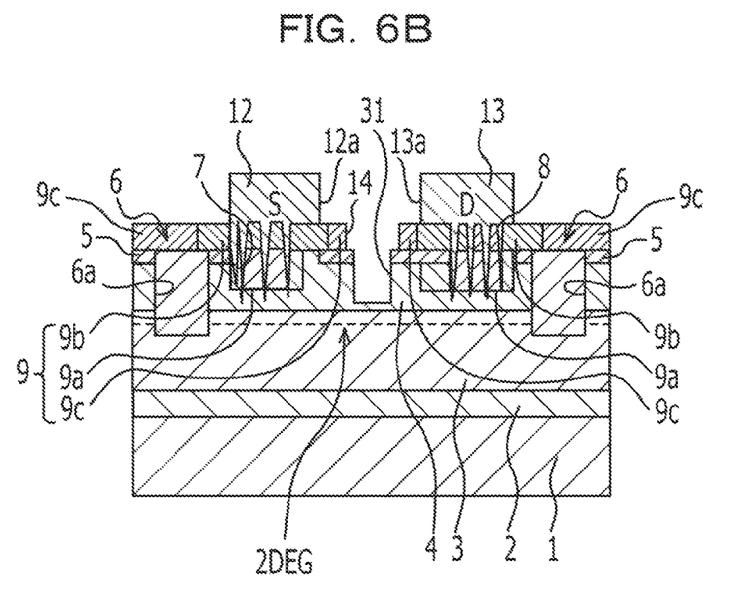

As illustrated in FIG. 6B, a recessed portion 31 is formed in an insulating film 5 that is exposed at a bottom surface of a formed opening 14 so as to reach a certain depth of an electron supply layer 4.

For example, the recessed portion 31 is formed to the insulating film 5 exposed at the bottom surface of the opening 14 by lithography and dry-etching so as to penetrate the insulating film 5 and to reach the certain depth of the electron supply layer 4. For example, the recessed portion 31 is formed narrower than the recessed portion 21 in FIG. 5B according to the second embodiment.

The resist used by the lithography is removed, for example, by peeling, for example.

Figure 6C:
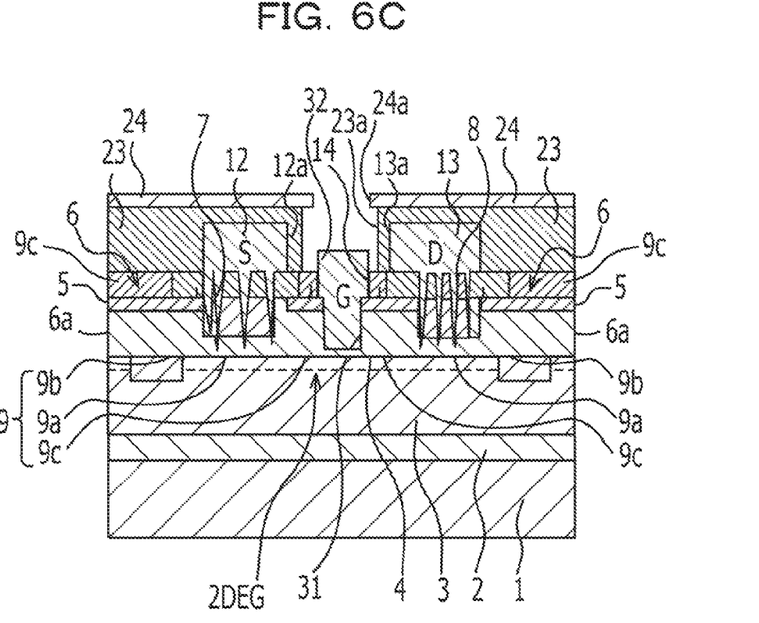
Figure 6D:
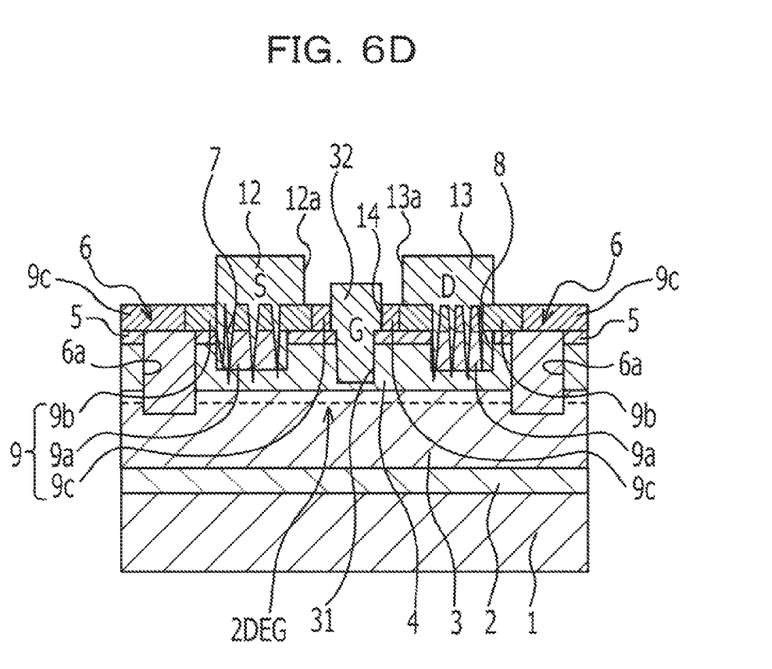

As illustrated in FIGS. 6C and 6D, a gate electrode 32 is formed.

As illustrated in FIG. 6C, a lower layer resist 23 (for example, PMGI manufactured by MicroChem Corporation, USA) and an upper layer resist 24 (for example, PFI32-A8 manufactured by Sumitomo Chemical Co., Ltd.) are formed by coating, for example with a spin coating method. An opening 24a with a diameter of, for example, about 0.8 µm is formed over the upper layer resist 24 by ultraviolet ray exposure.

The lower layer resist 23 is wet-etched with an alkaline developer using the upper layer resist 24 as a mask. The etching forms an opening 23a in the lower layer resist 23 that is larger than the opening 24a, and an eave-like structure as illustrated is formed.

Gate metal (for example, Ni with a film thickness of about 10 nm/Au with a film thickness of 300 nm) is deposited over an entire surface of substrate 1 including in the opening 24a and the opening 23a using the upper layer resist 24 and the lower layer resist 23 as masks. For convenience of illustration, the gate metal deposited over the upper layer resist 24 is not illustrated.

As illustrated in FIG. 6D, the lower layer resist 23, the upper layer resist 24, and the gate metal over the upper layer resist 24 are removed with a lift-off by using, for example warmed organic solvent. Accordingly, the gate electrode 32 of Ni/Au that fills the recessed portion 31 and the opening 14, and projects above the third n-GaN region 9c is formed.

After a certain time, the AlGaN/GaN FET is formed through forming an interlayer dielectric film and wirings, for example.

As described above, according to the alternative embodiment, the AlGaN/GaN FET is obtained that may significantly reduce on-resistance, provide good ohmic properties, and achieve a sufficiently high voltage operation and a high power. Moreover, the AlGaN/GaN FET may be applied to an electric circuit for supplying a high power with high reliability, for example.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiments in accordance with aspects of the present inventions have been described in detail, it should be understood that various changes, substitutions, and alterations could be made hereto without departing from the spirit and scope of the invention.

What is claimed is:

1. A compound semiconductor device comprising:
   an electron transit layer;
   an electron supply layer formed over the electron transit layer;
   a first recessed portion and a second recessed portion formed in the electron supply layer;
   a chemical compound semiconductor layer including impurities that buries the first recessed portion and the second recessed portion and covers over the electron supply layer;
   a gate electrode formed over the electron supply layer between the first recessed portion and the second recessed portion;
   a source electrode formed over the chemical compound semiconductor layer which buries the first recessed portion; and
   a drain electrode formed over the chemical compound semiconductor layer which buries the second recessed portion,
   wherein, in the chemical compound semiconductor layer under the source electrode and the drain electrode, a concentration of impurities near the first and second recess portion is higher than a concentration of impurities near the gate electrode, and
   an insulating film is formed directly above the electron supply layer and directly below the chemical compound semiconductor layer.

2. The compound semiconductor device according to claim 1, wherein a portion of materials of the source electrode and the drain electrode is diffused into the chemical compound semiconductor layer in the first recessed portion and the second recessed portion.

3. The compound semiconductor device according to claim 2, wherein
the source electrode and the drain electrode include a lamination of Ti, Al, M, and Au, and the M is selected from one of Ti, Ta, Ni, Mo and Pt.

4. The compound semiconductor device according to claim 2, wherein
the source electrode and the drain electrode include a lamination of Ta, Al, M, and Au, and the M is selected from one of Ti, Ta, Ni, Mo and Pt.

5. The compound semiconductor device according to claim 1, wherein
the insulating film is formed by a metal organic vapor phase epitaxial method.

6. The compound semiconductor device according to claim 1, wherein
the source electrode is formed biased to the gate electrode with respect to the first recessed portion, and
the drain electrode is formed biased to the gate electrode with respect to the second recessed portion.

* * * * *